US012780647B2

(12) United States Patent
Baumgaertner et al.

(10) Patent No.: US 12,780,647 B2
(45) Date of Patent: Nov. 3, 2026

(54) MICROMECHANICAL INERTIAL SENSOR, AND METHOD FOR OPERATING A MICROMECHANICAL INERTIAL SENSOR

(71) Applicant: Robert Bosch GmbH, Stuttgart (DE)

(72) Inventors: Daniel Baumgaertner, Budapest (HU); Sebastian Guenther, Tuebingen (DE); Amin Jemili, Kusterdingen (DE); Cristian Nagel, Reutlingen (DE); Jochen Reinmuth, Reutlingen (DE); Rolf Scheben, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 278 days.

(21) Appl. No.: 18/769,480

(22) Filed: Jul. 11, 2024

(65) Prior Publication Data

US 2025/0033952 A1 Jan. 30, 2025

(30) Foreign Application Priority Data

Jul. 25, 2023 (DE) ..................... 10 2023 207 069.3

(51) Int. Cl.
*B81B 3/00* (2006.01)
*G01P 15/125* (2006.01)

(52) U.S. Cl.
CPC .......... *B81B 3/0086* (2013.01); *G01P 15/125* (2013.01); *B81B 2201/0235* (2013.01); *B81B 2203/0307* (2013.01); *B81B 2203/04* (2013.01); *B81B 2203/056* (2013.01)

(58) Field of Classification Search
CPC ............................................... G01P 2015/0851
See application file for complete search history.

(56) References Cited

U.S. PATENT DOCUMENTS

| | | | | |
|---|---|---|---|---|
| 10,352,960 B1 * | 7/2019 | Shcheglov | G01P 15/097 | |
| 2007/0119252 A1 * | 5/2007 | Adams | G01P 15/125 | 73/514.32 |
| 2012/0160029 A1 * | 6/2012 | Yamaguchi | G01P 15/125 | 73/514.16 |
| 2013/0186171 A1 * | 7/2013 | Merrill, Jr. | G01P 15/125 | 73/514.16 |

(Continued)

FOREIGN PATENT DOCUMENTS

| | | | |
|---|---|---|---|
| DE | 102009026462 | A1 | 12/2010 |
| DE | 102013222747 | A1 | 5/2015 |

*Primary Examiner* — Stephen D Meier
*Assistant Examiner* — Ruben C Parco, Jr.
(74) *Attorney, Agent, or Firm* — NORTON ROSE FULBRIGHT US LLP

(57) ABSTRACT

A micromechanical inertial sensor and a method for its operation. The micromechanical inertial sensor includes: a sensor element; a substrate having a substrate plane; a detection device for detecting a mechanical deflection due to tilting or deformation of the sensor element about a rotation axis substantially parallel to the substrate plane, wherein the mechanical deflection due to the tilting or deformation takes place along a detection direction substantially perpendicular to the substrate plane, wherein the detection device includes a first electrode structure and a second electrode structure that are firmly anchored to the substrate, wherein the detection device generates a measurement signal from the detected mechanical tilting or deformation of the sensor element about the rotation axis.

7 Claims, 11 Drawing Sheets

(56) References Cited

U.S. PATENT DOCUMENTS

| | | | | |
|---|---|---|---|---|
| 2014/0252509 | A1* | 9/2014 | Merassi | B81B 3/0072 257/415 |
| 2015/0268268 | A1 | 9/2015 | Liu et al. | |
| 2015/0284243 | A1* | 10/2015 | Lasalandra | B81B 3/0081 438/53 |
| 2019/0162747 | A1* | 5/2019 | Thompson | G01P 15/125 |
| 2023/0314465 | A1* | 10/2023 | Kigure | G01P 15/18 73/514.32 |

* cited by examiner

MICROMECHANICAL INERTIAL SENSOR, AND METHOD FOR OPERATING A MICROMECHANICAL INERTIAL SENSOR

CROSS REFERENCE

The present application claims the benefit under 35 U.S.C. § 119 of German Patent Application No. DE 10 2023 207 069.3 filed on Jul. 25, 2023, which is expressly incorporated herein by reference in its entirety.

FIELD

The present invention relates to a micromechanical inertial sensor.

BACKGROUND INFORMATION

Micromechanical inertial sensors have now become a regular component of many electronic devices. The problem of bending or effects of mechanical stresses on such a micromechanical inertial sensor or on individual components of such a micromechanical inertial sensor can arise. This problem can be promoted by many defects; for example, soldering, mounting, and aging defects can have a considerable influence on bending within the micromechanical inertial sensor. Furthermore, long-term aging of the circuit boards and changes in humidity are likewise decisive for bending and deformations within the micromechanical inertial sensor. All this leads to a change in the sensor zero point or offset and severely limits the accuracy and sensitivity of the sensor.

Within the detection device of the micromechanical inertial sensor, this leads to the detection, in particular a differential detection, of the measurement signal, which includes both the detection of the deflection of the sensor element and the effects of mechanical stresses on the micromechanical inertial sensor or the detection device. Due to the effects of mechanical stresses on the detection device, the measurement signal also comprises signal components that result from such mechanical stresses and that cannot be compensated or can only be compensated with difficulty.

SUMMARY

It is an object of the present invention to provide a micromechanical inertial sensor which detects bending or effects of mechanical stresses within a detection device of the micromechanical inertial sensor by means of a suitable structure and suitably adjusts a measurement signal effectively and efficiently.

The micromechanical inertial sensor having features according the present invention the advantage over the related art that the further sensor element, which is firmly anchored to the substrate in comparison to the sensor element, responds independently, to the greatest possible extent, to an external acceleration and that the electrode structures arranged opposite the further sensor element can thus virtually only detect bending or effects of mechanical stresses on the micromechanical inertial sensor or the detection device. This is used to compensate efficiently and effectively for possible interference signal components or offset signal components, which result from the bending or effects of mechanical stresses, within the (detected) measurement signal or faulty signal.

A further advantage is that, due to the (separate) compensability of the bending or the mechanical stresses of the sensor arrangement, the size of the micromechanical inertial sensor according to the present invention does not represent a limiting factor. Due to the efficient and effective compensation of the bending or effects of mechanical stresses, a two to five times more accurate offset and sensitivity specification can be achieved for a conventional size of the micromechanical inertial sensor. For a thinner design in comparison to conventional designs and a resulting higher susceptibility to the effects of mechanical stresses, the same offset and sensitivity specification as for conventional designs can be ensured for the micromechanical inertial sensor according to the present invention due to the effective and efficient compensation. Furthermore, micromechanical inertial sensors of larger design or with a higher restoring force can likewise be realized since the bending or effects of mechanical stresses, for example with respect to the sensor housing, can also be compensated in this case.

According to an example embodiment of the present invention, a mechanical deflection due to tilting of the sensor element about a rotation axis (torsion spring) substantially parallel to the substrate plane is detected, wherein the mechanical deflection (due to the tilting) takes place along a detection direction substantially perpendicular to the substrate plane. The stiffer this (torsion) spring is selected to be, the more susceptible the sensor is to offset errors due to bending. According to the present invention, the bending can advantageously be measured separately and the useful signal can thus be corrected. The micromechanical inertial sensor according to the present invention can thus also be realized with a spring, in particular a torsion spring, of high stiffness. According to the present invention, problematic bending or effects of mechanical stresses can be compensated particularly effectively and efficiently because the further sensor element for detecting the bending or effects of mechanical stress can be embedded or integrated directly into the detection device (and thus also into the arrangement of the first and the second electrode structure) of the micromechanical inertial sensor. This in particular advantageously allows significantly better error corrections than is possible, for example, with non-embedded, separate stress sensors (at another location, i.e., outside the detection device, the component arrangement, for example in the chip package). In particular, it is advantageous according to the present invention that the bending of all fixed electrodes is measured and all relevant false signals can thus be detected.

Advantageous embodiments and developments of the present invention can be found in the disclosure herein.

According to an advantageous configuration of the present invention, it is provided that the micromechanical inertial sensor is configured in such a way that the effects of mechanical stresses on the inertial sensor in the measurement signal of the sensor element that is detected from the variable capacitances are compensated by means of a further measurement signal, wherein the further measurement signal is generated by the differential detection of the further variable capacitances. It is thus advantageously possible to compensate effectively and efficiently for the bending or effects of mechanical stresses within the detection device of the micromechanical inertial sensor by means of the further sensor element and the further measurement signal detected therefrom.

According to an advantageous configuration of the present invention, it is provided that the further sensor element and the sensor element are mechanically coupled (but electrically separated). Advantageously, this results in a substantially similar effect of bending or the effect of mechanical stresses on the sensor element and on the further sensor element. This leads to an increase in the accuracy of the compensation by means of the further measurement signal.

According to an advantageous configuration of the present invention, it is provided that the sensor element comprises a first sensor element and a second sensor element, wherein the first sensor element is arranged along the detection direction opposite the first electrode structure and the second electrode structure in such a way that a first variable capacitance is in each case formed between the first sensor element and the first electrode structure and between the first sensor element and the second electrode structure, wherein the second sensor element is arranged along the detection direction opposite the first electrode structure and the second electrode structure in such a way that a second variable capacitance is in each case formed between the second sensor element and the first electrode structure and between the second sensor element and the second electrode structure, wherein, in comparison to the second sensor element, the first sensor element has a coupling in the detection direction that is at least 2 times stronger, in particular a coupling in the detection direction that is at least 10 times stronger, to the substrate. This advantageously makes it possible to achieve a very large measuring range for the micromechanical inertial sensor by switching between detecting a deflection of the first sensor element and of the second sensor element. The compensation of the first and second measurement signals differentially detected from the first variable capacitances and second variable capacitances, respectively, is ensured in both cases by the further measurement signal differentially detected from the further variable capacitances.

According to an advantageous configuration of the present invention, it is provided that, in comparison to the sensor element, the further sensor element has a coupling in the detection direction that is at least 50 times stronger, in particular a coupling in the detection direction that is at least 200 times stronger, to the substrate. This advantageously results in an effective use of the further sensor element on the one hand for compensating for the bending or effects of mechanical stresses on the micromechanical inertial sensor or on the detection device and, on the other hand, in the case of high acceleration or maximum deflection of the sensor element, for detecting a measurement signal from the deflection of the further sensor element at high acceleration.

According to an advantageous configuration of the present invention, it is provided that an anchoring structure of the further sensor element differs from an anchoring structure of the first electrode structure and/or an anchoring structure of the second electrode structure. It is thus advantageously possible for the anchoring structure of the further sensor element to be implemented efficiently and in a space-saving manner in an existing detection device.

A further subject matter of the present invention is a method for operating a micromechanical inertial sensor.

The method according to an example embodiment of the present invention for operating a micromechanical inertial sensor proves to be advantageous over the related art in that the further sensor element responds independently, to the greatest possible extent, to an external acceleration and thus only responds sensitively to the bending or effects of mechanical stresses on the micromechanical inertial sensor. Possible offset signal components resulting from the bending or effects of mechanical stresses can thus be compensated efficiently and effectively within the measurement signal or faulty signal.

Additionally, according to an example embodiment of the present invention, the size with which the micromechanical inertial sensor is produced can be adjusted or varied to a greater extent since mechanical stresses, due to their compensability, do not represent a limiting factor on the size, or at least only do so to a lesser extent. By effectively compensating for the interfering influences due to bending or effects of mechanical stresses, a considerably improved offset and sensitivity specification can be achieved with a conventional size, in particular an offset and sensitivity specification that is improved by two to five times. Alternatively, a thinner design may also be provided. In this case, although this results in a higher susceptibility to mechanical stresses for the micromechanical inertial sensor in operation, the structure of the sensor according to the present invention and its operation can ensure the same offset and sensitivity specification as conventional designs. Furthermore, the method according to the present invention for operating the micromechanical inertial sensor also allows for designs of larger size or with a higher restoring force since bending or effects of mechanical stresses on the housing can be compensated separately during operation of the micromechanical inertial sensor and are thus limited.

The same advantages and configurations that were described in connection with the embodiments of the micromechanical inertial sensor according to the present invention can be applied to the method for operating a micromechanical inertial sensor according to the present invention.

Exemplary embodiments of the present invention are illustrated in the figures and explained in more detail in the following description.

DETAILED DESCRIPTION OF EXAMPLE EMBODIMENTS

Figure 1:
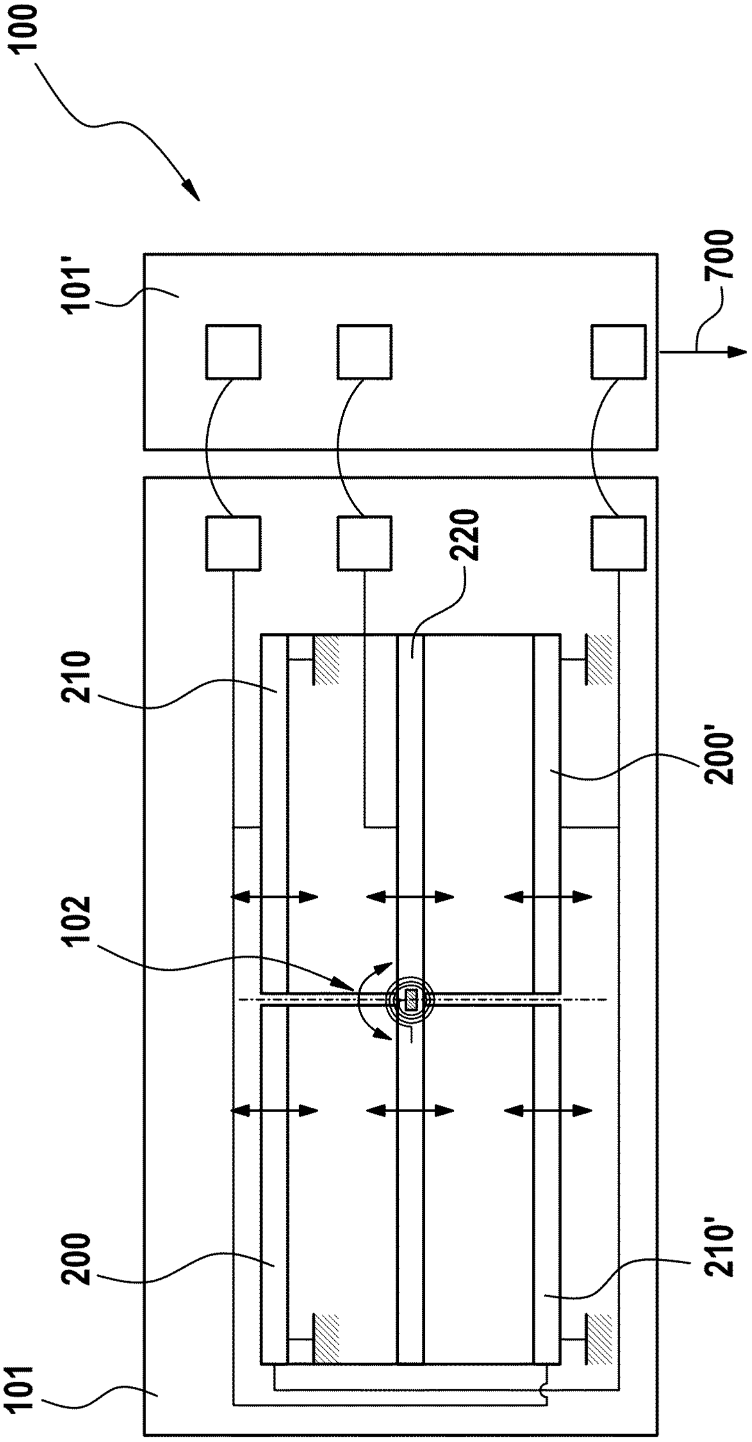
FIG. 1 Related Art
FIG. 1 shows a schematic representation of a micromechanical inertial sensor according to the related art.

FIG. 1 shows a schematic representation of a micromechanical inertial sensor 100 according to the related art in a side view, i.e., the drawing plane is to be understood as being perpendicular to a substrate plane. Shown within a MEMS structure 101 are a first electrode structure 200, 200' and a second electrode structure 210, 210' as well as a sensor element 220 which can be tilted about a rotation axis 102 so that a mechanical deflection due to this tilting takes place in a detection direction substantially perpendicular to the substrate plane. The first electrode structure 200, 200' and the sensor element 220 as well as the second electrode structure 210, 210' and the sensor element 220 in each case form a variable capacitance. The variable capacitances are related in a manner known for MEMS structures; a differential evaluation of the tilting of the sensor element 220 about the rotation axis 102 is made possible in a conventional manner by the arrangement. The capacitive signals are forwarded to an ASIC structure 101' and detected differentially there.

Furthermore, a measurement signal 700 is generated by means of the differential detection. The measurement signal 700 is a faulty signal since, in addition to the useful signal component that is actually to be measured and results from the tilting of the sensor element 220 about the rotation axis 102, the measurement signal 700 also contains interference signal components or offset components that result from bending or effects of mechanical stresses on the micromechanical inertial sensor 100. The measurement signal 700 is thus a faulty signal 700 due to the effects of mechanical stresses.

Figure 2:
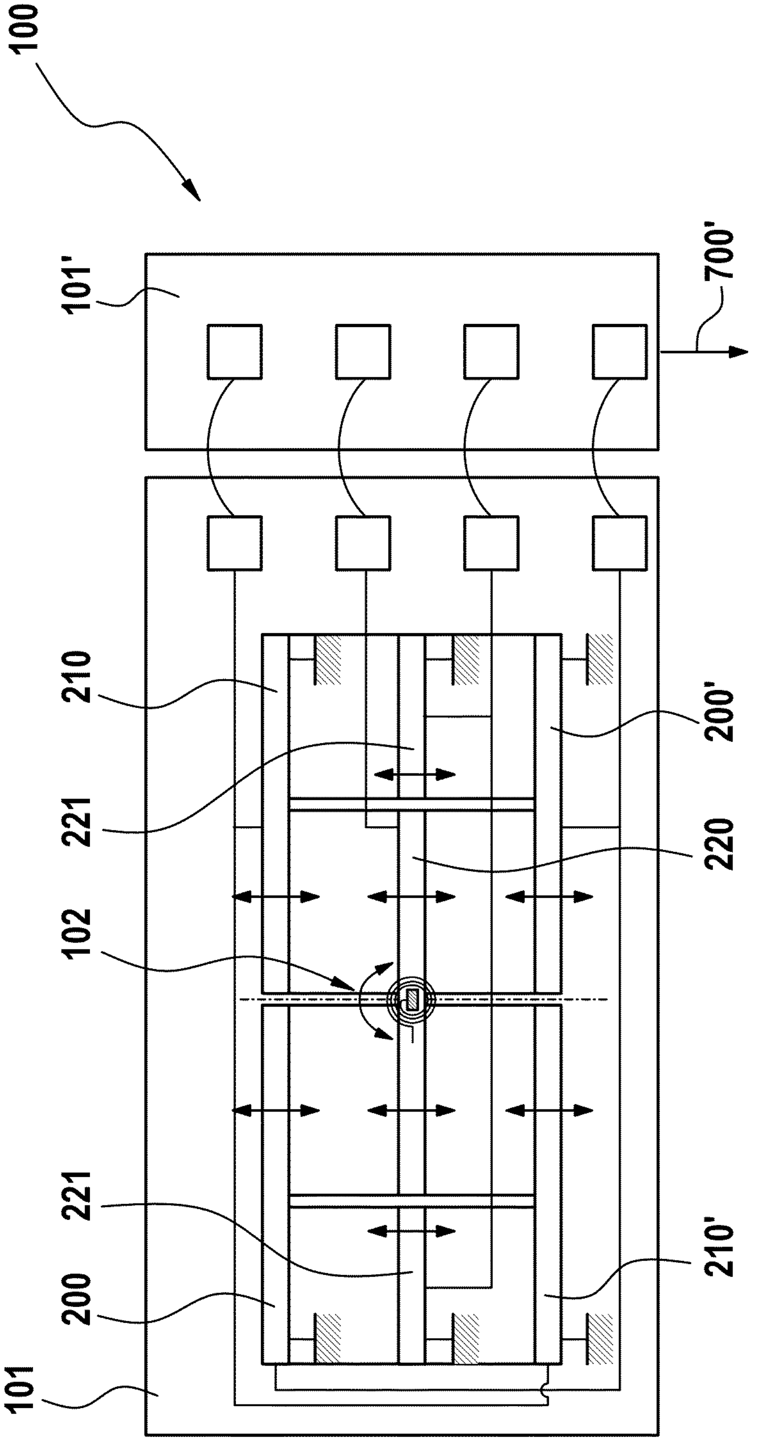
FIG. 2 shows a schematic representation of a micromechanical inertial sensor according to an example embodiment of the present invention.

FIG. 2 shows a schematic representation of a micromechanical inertial sensor 100 according to the present invention, likewise in a side view, i.e., the drawing plane is to be understood as being perpendicular to a substrate plane. Shown within the MEMS structure 101 are again the first electrode structure 200, 200 'and the second electrode structure 210, 210', as well as the sensor element 220 which can be tilted about the rotation axis 102 so that a mechanical deflection due to this tilting takes place in a detection direction substantially perpendicular to the substrate plane. This detection direction corresponds to a vertical direction in FIG. 2, i.e., the tilting of the sensor element 220 corresponds to a movement (of parts) of the sensor element 220 (depending on their distance from the rotation axis 102) upward or downward according to the representation in FIG. 2. According to the present invention, in addition to the sensor element 220, the micromechanical inertial sensor comprises a further sensor element 221, which, in comparison to the sensor element 220, is firmly (or more firmly) anchored to or on the substrate. The first electrode structure 200, 200' (hereinafter also referred to as C1 electrodes) and the sensor element 220 as well as the second electrode structure 210, 210' (hereinafter also referred to as C2 electrodes) and the sensor element 220 in each case form the variable capacitance or the variable capacitances. In addition, the first electrode structure 200, 200' and the further sensor element 221 as well as the second electrode structure 210, 210' and the further sensor element 221 in each case form a further variable capacitance or further variable capacitances. These are likewise related in a manner known for MEMS structures and are likewise read out differentially within the ASIC structure 101', separately from the variable capacitances 300. The measurement signal 700 generated from the variable capacitances is compensated there by means of a further measurement signal differentially detected and generated from the further variable capacitances, and a compensated measurement signal 700' is thus generated. By means of the information from the differential reading of the further variable capacitances, it is thus possible according to the present invention to detect interfering effects, based in particular on bending or mechanical stresses, by means of the further measurement signal in order to compensate for such interfering effects or interference signal components in the measurement signal 700 to the greatest possible extent. The compensated measurement signal 700' therefore substantially contains the useful signal component and is free of the bending or effects of mechanical stresses in the form of interference signal components or offset components.

Figure 3A:
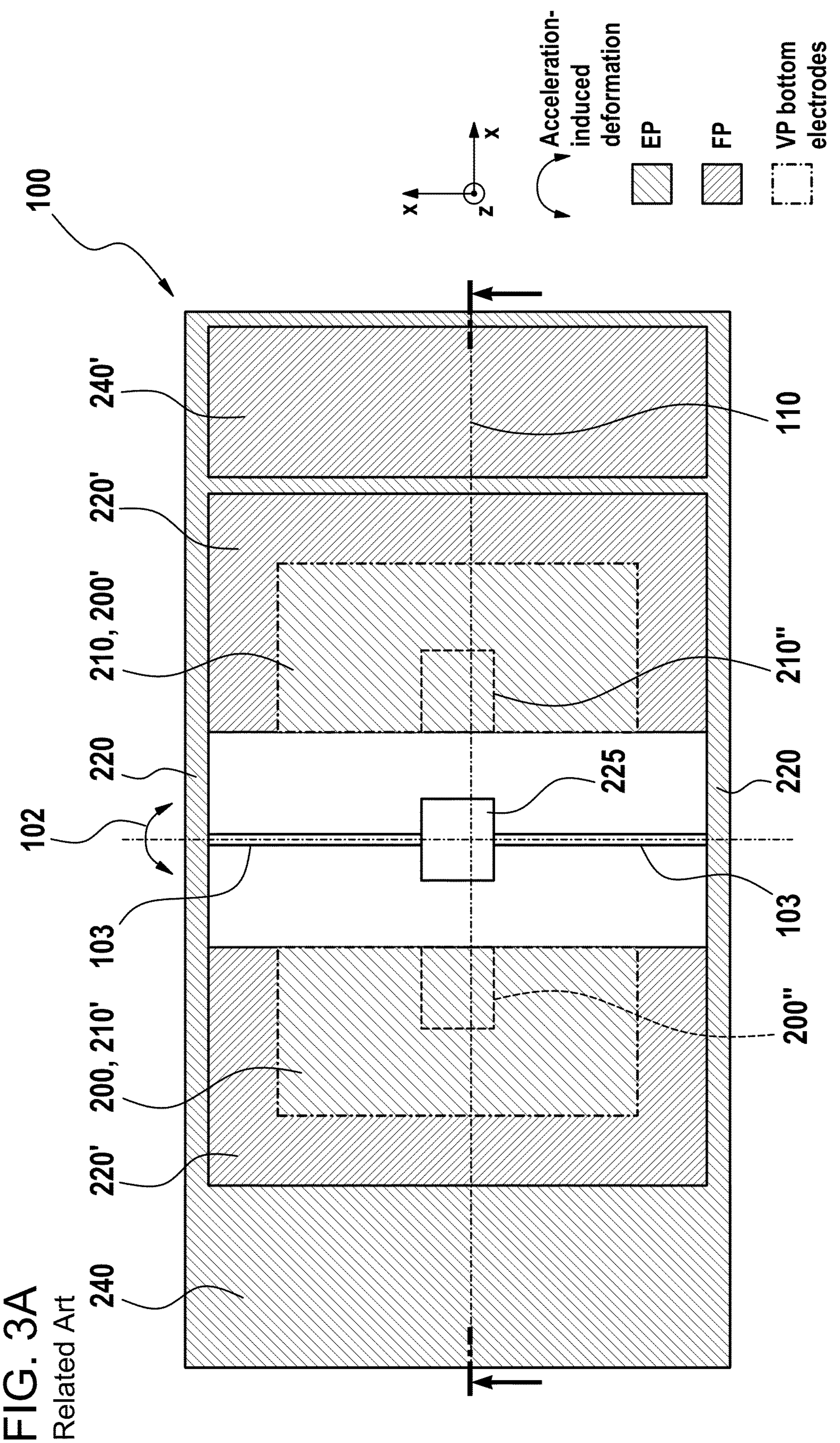
FIG. 3A Related Art
FIGS. 3A to 3D show a schematic representation of the micromechanical inertial sensor according to the related art.
Figure 3D:
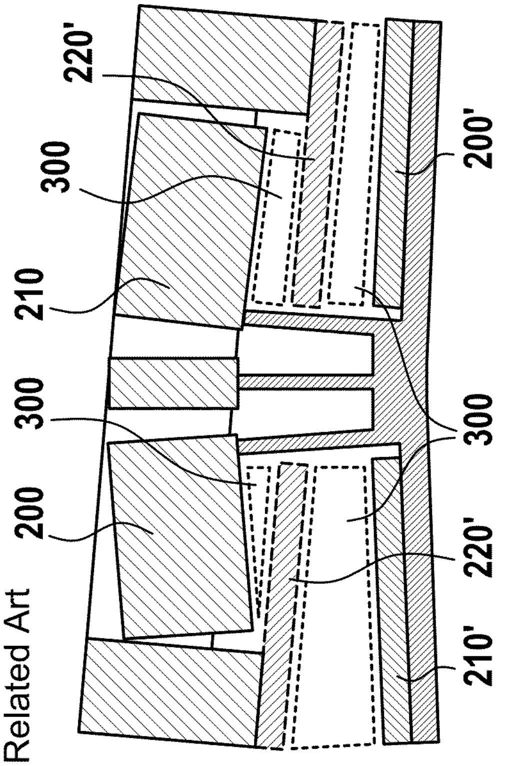
FIG. 3D Related Art
Figure 3B:
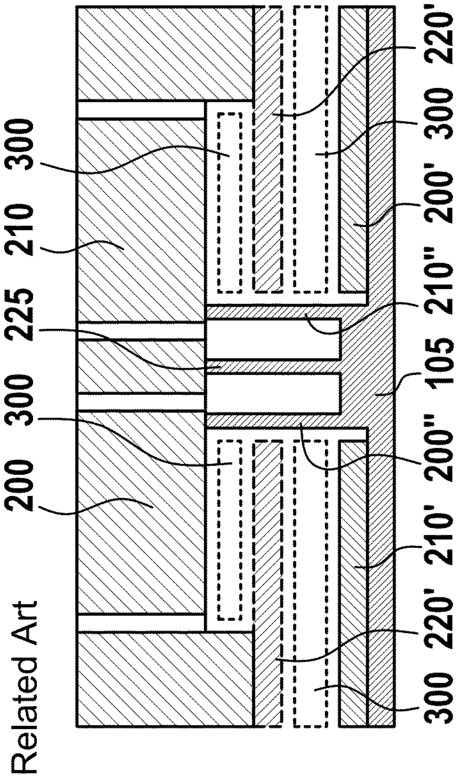
FIG. 3B Related Art
Figure 3C:
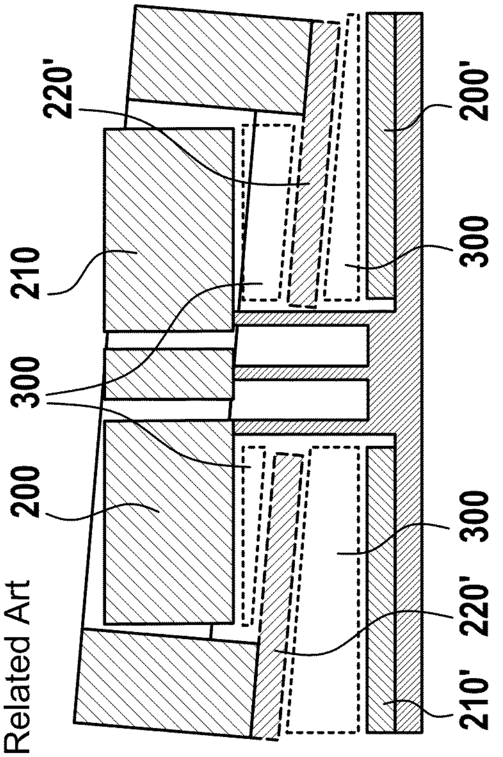
FIG. 3C Related Art

FIGS. 3A to 3D show a schematic representation (of the MEMS element 101) of the micromechanical inertial sensor 100 according to the related art. FIG. 3A is a schematic plan view of the micromechanical inertial sensor 100, while FIG. 3B to 3D are side views according to the section line 110 (in FIG. 3A) for various operating states or situations. By means of a two-sided torsion spring 103, the sensor element 220 can be tilted about the rotation axis 102, which is parallel to the substrate plane of the substrate 105. The torsion spring 103 and thus also the sensor element 220 are fixed or anchored relative to the substrate 105 via a substrate anchor 225. The mass distribution of the sensor element 220 is asymmetrical: the sensor element 220 has a lower mass on the one side of the rotation axis 102 (shown on the right in FIGS. 3A-3D) due to a recess 240' (in its frame-like structure, hereinafter also referred to as the box side) than on the other side of the rotation axis 102 (shown on the left in FIGS. 3A to 3D), on which the sensor element 220 comprises an (in comparison to the other side) additional mass element 240 (hereinafter also referred to as the mass side). Due to the elastic mounting and the asymmetrical mass distribution of the sensor element 220 (due to the mass element 240 thereof and the recess 240'), the seismic mass or the sensor element 220 is mechanically deflected or tilted by an angle (tilt angle) when vertical acceleration is applied; deflection and acceleration are largely proportional here, at least for small tilt angles. The frame-like part of the sensor element 220 (as well as the additional mass element 240) is realized in particular in a layer consisting of or comprising epi-poly (EP) material.

Connected to the sensor element 220, the latter has its (associated) electrode 220', hereinafter also referred to as the CM electrode 220', underneath (i.e., in a direction toward the substrate 105), in particular in the form of an FP plate (i.e., realized in another layer of the inertial sensor 100). The FP plate (and thus also the CM electrode) 220' of the sensor element 220 is in particular largely flat.

When the sensor element 220 is tilted about the rotation axis 102, the CM electrode 220' moves along a detection direction substantially perpendicular to the substrate plane (this movement in the detection direction is more or less large depending on the distance of the corresponding (considered) part of the CM electrode 220' from the rotation axis 102).

Furthermore, the micromechanical inertial sensor 100 according to the related art also comprises the first electrode structure 200, 200' and the second electrode structure 210, 210'. The first electrode structure 200, 200' and also the second electrode structure 210, 210' (hereinafter also referred to jointly as fixed electrodes) in each case comprises:

- an electrode on the one side and on the other side of the rotation axis 102 as well as above (i.e., on the side facing away from the substrate 105) the CM electrode 220' of the sensor element 220, denoted by reference sign 200 for the first electrode structure and by reference sign 210 for the second electrode structure, and
- an electrode on the one side and on the other side of the rotation axis 102 and underneath (i.e., on the side facing the substrate 105) the CM electrode 220' of the sensor element 220, denoted by reference sign 210' for the first electrode structure and by reference sign 200' for the second electrode structure.

Both the electrodes 200, 200' of the first electrode structure and the electrodes 210, 210' of the second electrode structure are electrically connected to one another and, together with the CM electrode 220' of the sensor element 220, they form a variable capacitance 300 depending on the deflection (tilting) of the sensor element 220 in the detection direction. By means of this arrangement, it is possible, in a conventional manner for MEMS structures, to make it possible to differentially evaluate the tilting of the sensor element 220 about the rotation axis 102; the capacitive signals are forwarded to the ASIC structure 101' (not shown in FIGS. 3A-3D) and are differentially detected there for generating the measurement signal 700. The first and the second electrode structure 200, 200', 210, 210' thus form a differential capacitor that is divided into four separate quadrants (around the rotation axis 102).

The electrodes 200, 210 (of the first and the second electrode structure) in each case arranged above the CM electrode 220' of the sensor element 220 are firmly connected to the substrate wafer 105 via in each case separate anchors 200"(for electrode 200) or 210" (for electrode 210). The electrodes 200', 210' (of the first and the second electrode structure) in each case arranged underneath the CM electrode 220' of the sensor element 220 are located directly on the substrate 105 and are firmly connected thereto. FIG. 3B) shows the situation without a mechanical deflection of the sensor element 220, while FIG. 3C shows the situation with such a deflection. It can be seen that the (portions of the) variable capacitance 300 is/are in each case realized between the sensor element 220 (or between its CM electrode 220') and the first and the second electrode structure 200, 200', 210, 210'; by evaluating this variable capacitance 300, a deflection of the sensor element 220 (or of the CM electrode 220' moving with it) can thus be measured; cf. the capacitance portions 300 of this variable capacitance shown in FIG. 3C as wedge-shaped or trapezoidal (each with the same slope or inclination, due to the assumed (ideal) situation without any bending). In the case of deformations of the substrate 105, the electrode distance between the bottom electrodes (i.e., the electrodes 210', 200') and the CM electrode 220' of the sensor element 220 also changes (and changes in distance and thus false signals can also occur due to bending of the top electrodes (i.e., the electrodes 200, 210)); this results in the faulty measurement signal 700 in arrangements according to the related art. Such a situation in the case of deformations is indicated by means of the representation in FIG. 3D, in which the (portions of the) variable capacitance 300 are likewise shown as wedge-shaped or trapezoidal but, due to the deformation or bending, not with the same (or with an at least potentially different) slope or inclination.

Figure 4A:
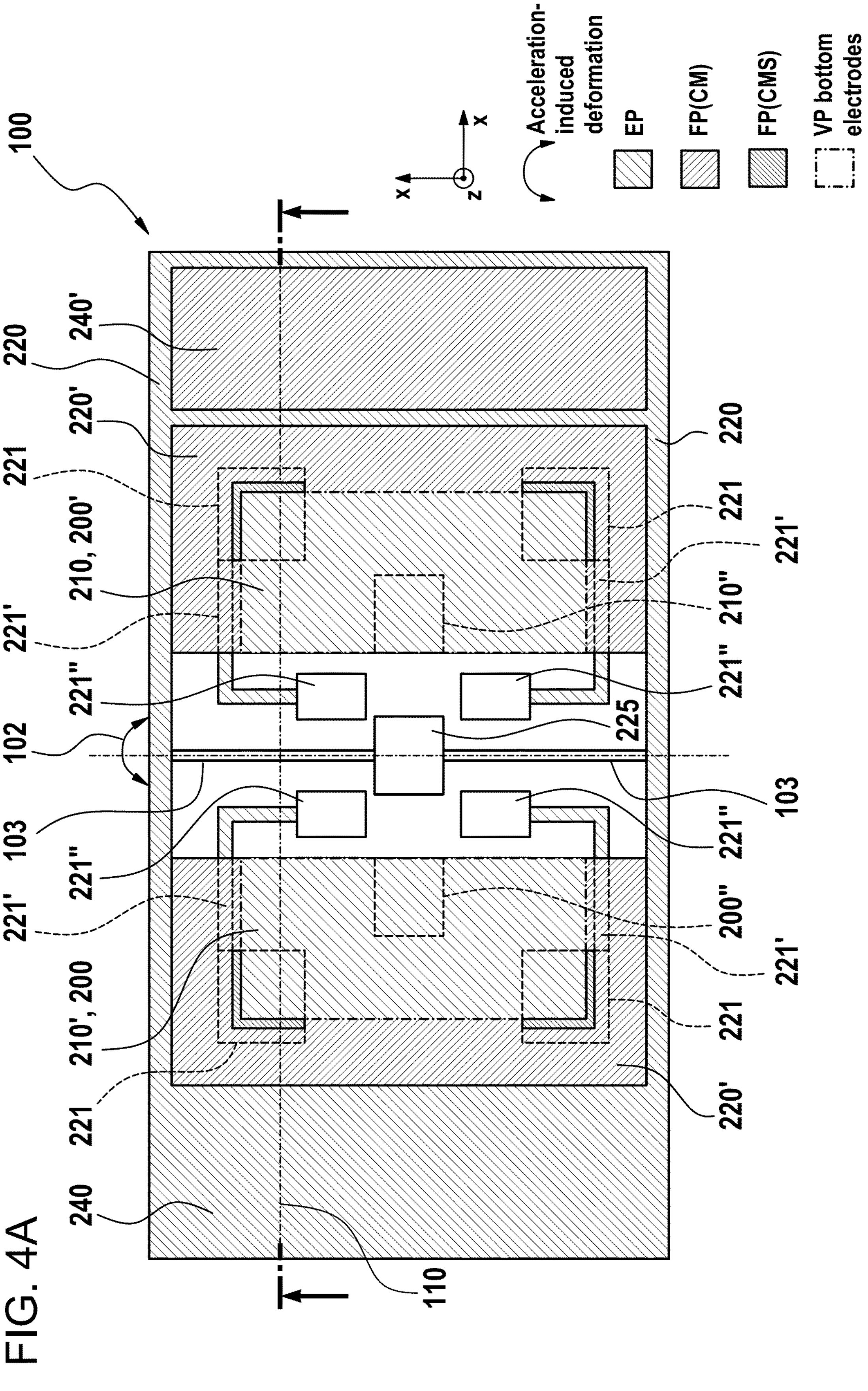
FIGS. 4A to 4D show an example embodiment of the micromechanical inertial sensor according to the present invention.
Figure 4D:
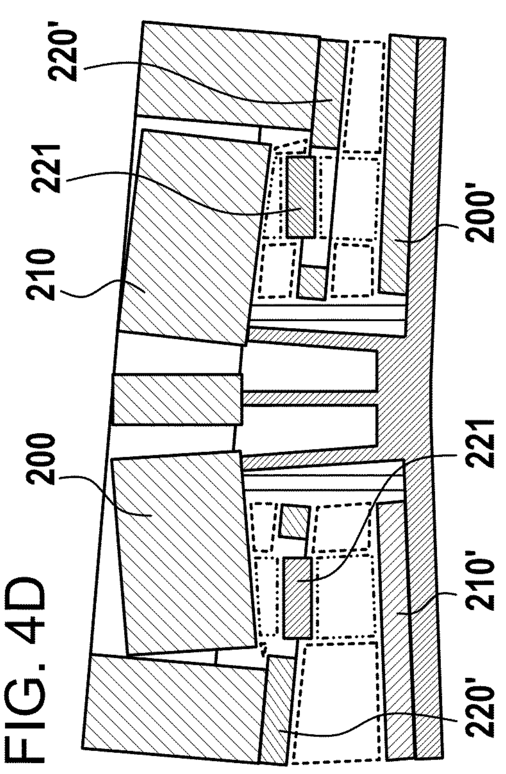
Figure 4B:
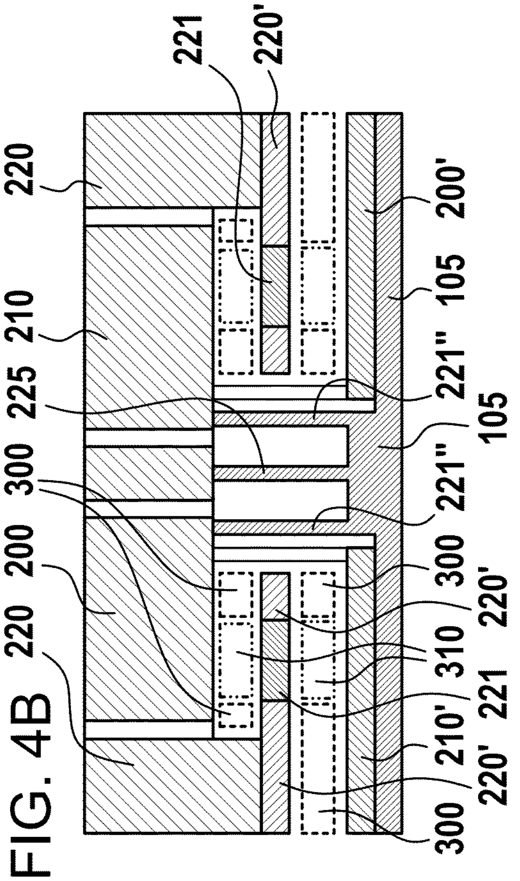
Figure 4C:
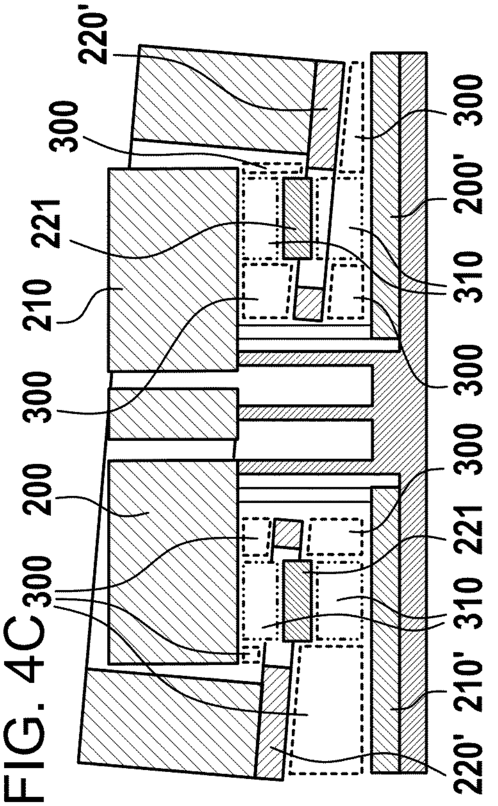

FIGS. 4A to 4D show a schematic representation (of the MEMS element 101) of the micromechanical inertial sensor 100 according to a first embodiment of the present invention. FIG. 4A is a schematic plan view of the micromechanical inertial sensor 100 according to the present invention, while FIGS. 4B to 4D are side views according to the section line 110 (in FIG. 4A)) for various operating states or situations.

Again, the sensor element 220 can be tilted or mechanically deflected about the rotation axis 102 by means of a two-sided torsion spring 103, and the rotation axis 102 is again parallel to the substrate plane or main extension plane of the substrate 105. The torsion spring 103 is fixed or anchored relative to the substrate 105 via a substrate anchor 225; the sensor element 220 (connected to the torsion spring 103) is thus also fixed or anchored relative to the substrate 105 but is connected so as to be movable with respect to a mechanical deflection, in particular with respect to the mechanical deflection or tilting about the rotation axis 102 (or about the torsion spring 103) which is primarily considered here.

Analogously to the representation according to FIGS. 3A-3D, according to all embodiments of the present invention, the mass distribution of the sensor element 220 is asymmetrical, i.e., the sensor element 220 has a lower mass on the one side of the rotation axis 102 (shown on the right in FIGS. 4A-4D) due to a recess 240' (in its frame-like structure, hereinafter also referred to as the box side) than on the other side of the rotation axis 102 (shown on the left in FIGS. 4A-4D), on which the sensor element 220 comprises an (in comparison to the other side) additional mass element 240 (hereinafter also referred to as the mass side). Due to the elastic mounting or suspension by means of the torsion spring 103 and the asymmetrical mass distribution of the sensor element 220 (due to the mass element 240 thereof on the one side and the recess 240' on the other side), the seismic mass or the sensor element 220 is mechanically deflected or tilted by an angle (tilt angle) when vertical acceleration is applied; deflection and acceleration are largely proportional here, at least for small tilt angles. The frame-like part of the sensor element 220 (as well as the additional mass element 240) is realized in particular in a layer consisting of or comprising epi-poly (EP) material.

Connected to the sensor element 220, the latter has its (associated) electrode 220', hereinafter also referred to as the CM electrode 220', underneath (i.e., in a direction from the EP layer toward the substrate 105), in particular realized in the form of an FP plate (i.e., realized in a layer of the inertial sensor 100 other than the EP layer). The FP plate (and thus also the CM electrode) 220' of the sensor element 220 is in particular largely flat.

Again (i.e., analogously to the representation according to FIGS. 3A-3D), when the sensor element 220 is tilted about the rotation axis 102, the CM electrode 220' moves along a detection direction substantially perpendicular to the substrate plane (this movement in the detection direction is more or less large depending on the distance of the corresponding (considered) part of the CM electrode 220' from the rotation axis 102).

And again, the micromechanical inertial sensor 100 according to the present invention (according to all embodiments of the present invention) also has the first electrode structure 200, 200' and the second electrode structure 210, 210'. The first electrode structure 200, 200' and also the second electrode structure 210, 210' (hereinafter also referred to jointly as fixed electrodes) each comprise:

- an electrode on the one side and on the other side (in a plan view) of the rotation axis 102 and above (i.e., on the side facing away from the substrate 105) the CM electrode 220' of the sensor element 220, denoted by reference sign 200 for the first electrode structure and by reference sign 210 for the second electrode structure, and
- an electrode on the one side and on the other side (likewise in a plan view) of the rotation axis 102 and underneath (i.e., on the side facing the substrate 105) the CM electrode 220' of the sensor element 220, denoted by reference sign 210' for the first electrode structure and by reference sign 200' for the second electrode structure.

Again, the electrodes 200, 200' of the first electrode structure are electrically connected to one another, and the electrodes 210, 210' of the second electrode structure are furthermore also electrically connected to one another (but separately from the first electrode structure). They form a variable capacitance 300 with the CM electrode 220' of the sensor element 220 depending on the deflection (tilting) of the sensor element 220 in the detection direction. By means of this arrangement, it is also possible according to all embodiments of the present invention (and shown schematically in FIGS. 4A-4D), in a conventional manner for MEMS structures and in particular as shown in FIGS. 3A-3D, to make it possible to differentially evaluate the tilting of the sensor element 220 about the rotation axis 102; the capacitive signals are in this case forwarded to the ASIC structure 101' (not shown in FIGS. 4A-4D) and are differentially detected there for generating the measurement signal 700. The first and the second electrode structure 200, 200', 210, 210' thus form a differential capacitor that is divided into four separate quadrants (around the rotation axis 102).

Again, in FIGS. 4A-4D as well (but only shown in FIG. 4A), and according to all embodiments of the present invention, it is provided that the electrodes 200, 210 (of the first or second electrode structure) in each case arranged above the CM electrode 220' of the sensor element 220 are firmly connected to the substrate wafer 105 via in each case separate anchors 200" (for electrode 200) or 210" (for electrode 210); and, likewise, the electrodes 200', 210' (of the first and the second electrode structure) in each case arranged underneath the CM electrode 220' of the sensor element 220 are in particular located according to the present invention directly on the substrate 105 and are firmly connected thereto.

In contrast to arrangements according to the related art, it is however provided according to the present invention that, in addition to the sensor element 220, a further sensor element 221 is present, viz., preferably within the core of the inertial sensor 110, i.e., in particular directly adjacent to the sensor element 220 (and in particular also arranged symmetrically with respect to the rotation axis 102).

In the plan view according to FIG. 4A, the further sensor element 221 is fastened or connected by means of at least one further substrate anchor 211" (hereinafter also referred to as CMS anchor), which is arranged according to the present invention as closely as possible to the main anchor 225 (i.e., the substrate anchor 225 by means of which the torsion spring 103 is suspended relative to the substrate 105), i.e., as centrally as possible. According to the present invention, it is in particular provided that the further sensor element 221 is connected to the further substrate anchor 221" via at least one further connecting element 221'. According to the embodiment or basic variant of the present invention shown in FIGS. 4A-4D, four further substrate anchors 211" (i.e., additional substrate anchors or CMS anchors), by way of example, are placed as centrally as possible and as closely as possible to the main anchor (CM anchor 225). At the CMS anchors 221", the (exemplary) four further sensor elements 221 are guided by means of EP structures (i.e., the connecting elements 221', which are in particular formed as part of the EP layer) to the outer edge (in the example into the corners) of the top electrodes (200, 210). At these outer edges, it is provided according to the present invention that regions are cut out of the FP layer (i.e., out of the layer of the CM electrode 220') (or electrically separable regions are formed by means of recesses in this layer). According to the present invention, it is thus possible to insert electrodes at CMS potential (CMS electrodes, i.e., the further sensor element 221 or the electrodes of the further sensor element 221) at the same location. This creates a second differential capacitor (i.e., the further variable capacitance) 310, which is used according to the present invention for the stress evaluation, in addition to the actual differential capacitor 300 of the sensor (or variable capacitance 300 between the sensor element 220 and the first and the second electrode arrangement 200, 200 ‘, 210, 210’). According to the present invention, the stiffness of the EP connections 211' to the CMS electrodes 221 is in particular significantly greater than the stiffness of the spring suspension of the sensor, i.e., of the sensor element 220. The differential capacitor of the stress electrode (i.e., the further variable capacitance 310) therefore does not respond (or at least responds to a considerably weaker extent) to external accelerations (along the sensitive direction of the sensor), but substantially only responds to bending of the electrodes of the first and the second electrode arrangement 200, 200', 210, 210' and of the CMS electrodes 221. An example of such a situation is shown in FIG. 4D. For the sake of simplicity, FIG. 4B (analogously to FIG. 3B) again shows the situation without a mechanical deflection of the sensor element 220 (and also without bending), while FIG. 4C shows the situation with such a deflection but likewise without bending. It can again be seen that the (portions of the) variable capacitance 300 is/are in each case realized between the sensor element 220 (or between its CM electrode 220') and the first and the second electrode structure 200, 200', 210, 210'; by evaluating this variable capacitance 300, a deflection of the sensor element 220 (or of the CM electrode 220' moving with it) can thus be measured. Due to the fact that the section line 110 (relevant to FIGS. 4B to 4D) in FIG. 4A intersects the CMS electrodes 221, it is visible in FIGS. 4B to 4D that the plane of the CM electrode 220' is interrupted at the locations of the CMS electrodes 221 shown and that the CMS electrodes 221, which are held or connected to the substrate 105 by means of the connecting elements 221' (also produced by means of gaps or separating recesses in the EP plane) (and the further substrate anchors 211"), are located in this gap; however, these connecting elements 221' are not shown in FIGS. 4B to 4D for the sake of simplicity.

For this reason, in FIG. 4B to 4D, the regions of the variable capacitance 300 are interrupted by regions of the further variable capacitance 310 (which correspond to those regions of the first or the second electrode structure 200, 200', 210, 210' that are arranged opposite the CMS electrode 221 or opposite the plurality of CMS electrodes 221).

As already mentioned, FIG. 4B shows the situation without a mechanical deflection of the sensor element 220 (and without bending), while FIG. 4C shows the situation with such a deflection, cf. the capacitance portions of the variable capacitance 300 and of the further variable capacitance 310 shown in FIG. 4C wedge-shaped or trapezoidal (each with the same slope or inclination, due to the assumed (ideal) situation without any bending).

According to the present invention, it is thus also the case, as in the related art (cf. FIGS. 3A-3D), that, in the case of deformations or bending of the substrate 105, the electrode distance between the bottom electrodes (i.e., the electrodes 210', 200') and the CM electrode 220' of the sensor element 220 (and likewise the distances due to bending of the top electrodes, i.e., the electrodes 200, 210) changes and faulty measurement signals 700 thus arise; however, it is advantageously possible according to the present invention to be able to compensate for this faulty measurement signal on the basis of the measurement of the further variable capacitance 310 because, according to the present invention, the influence of such deformations or bending of the substrate 105 can be detected separately (from the signal 700 caused by the acceleration to be measured) by means of the CMS electrode(s) 221 arranged locally in the (lateral) region of the CM electrode 220' (i.e., in a recess or gap thereof). Such a situation of deformations is indicated in FIG. 4D; the (portions of the) variable capacitance 300 or of the further variable capacitance 310 is/are shown wedge-shaped or trapezoidal but, due to the deformation or bending, not with the same (or with an at least potentially different) slope or inclination.

The position and shape of the CMS electrodes can basically be freely selected along the stress sensor suspension (i.e., the connecting elements 221'). In the variant or embodiment shown in FIGS. 4A-4D, the CMS electrodes 221 are square and placed in the outermost corners of the top electrodes 200, 210. Also possible are elongate CMS electrodes 221, which are inserted along the vertical bars. According to the present invention, this design freedom facilitates the actual configuration of the stress sensor (i.e., the configuration and placement of the CMS electrode or of the further sensor element 221) and its integration into the inertial sensor, i.e., the arrangement of the further sensor elements 221 in the region of the CM electrode 220'.

The CMS electrode 221 and the CM electrode 220' of the seismic mass are electrically and mechanically separated from one another; however, they can also be realized to be mechanically coupled (at least to some extent) and electrically separated. In particular, they are connected with separate bond pads to the ASIC structure 101' (cf. FIG. 2). The first electrode structures 200, 200' and the second electrode structure 210, 210' are in each case guided together to the MEMS bond pads (sensor pads C1 and C2). In this case, no electrical separation is necessary between the differential capacitor of the stress electrodes (further variable capacitance 310) and the measuring electrodes (variable capacitance 300); the first and second electrode structures 200, 200', 210, 210' are thus used simultaneously for acceleration measurement and stress measurement.

In the "normal" Acc measuring mode (i.e., acceleration measuring mode), the ASIC (ASIC structure 101') evaluates the MEMS element (or the acceleration sensor) via the electrodes CM/C1/C2. In contrast, in the "correction mode," the sensor is evaluated via the electrodes CMS/C1/C2. By switching the CM electrode to the CMS electrode at the input of the ASIC, it is possible according to the present invention to switch between these two modes or operating modes.

The capacitance value measured by the stress sensor can be used directly to compensate for the offset and sensitivity error in the ACC sensor signal 700, in the simplest case by means of linear scaling, for example. However, by measuring the sensor deformation, more complex evaluation logic can also be implemented in the ASIC. It is also possible to permanently compensate for the error signals in multiplexing.

FIGS. 5 to 9 show further embodiments (of the MEMS element) of the micromechanical inertial sensor according to the present invention.

Figure 5:
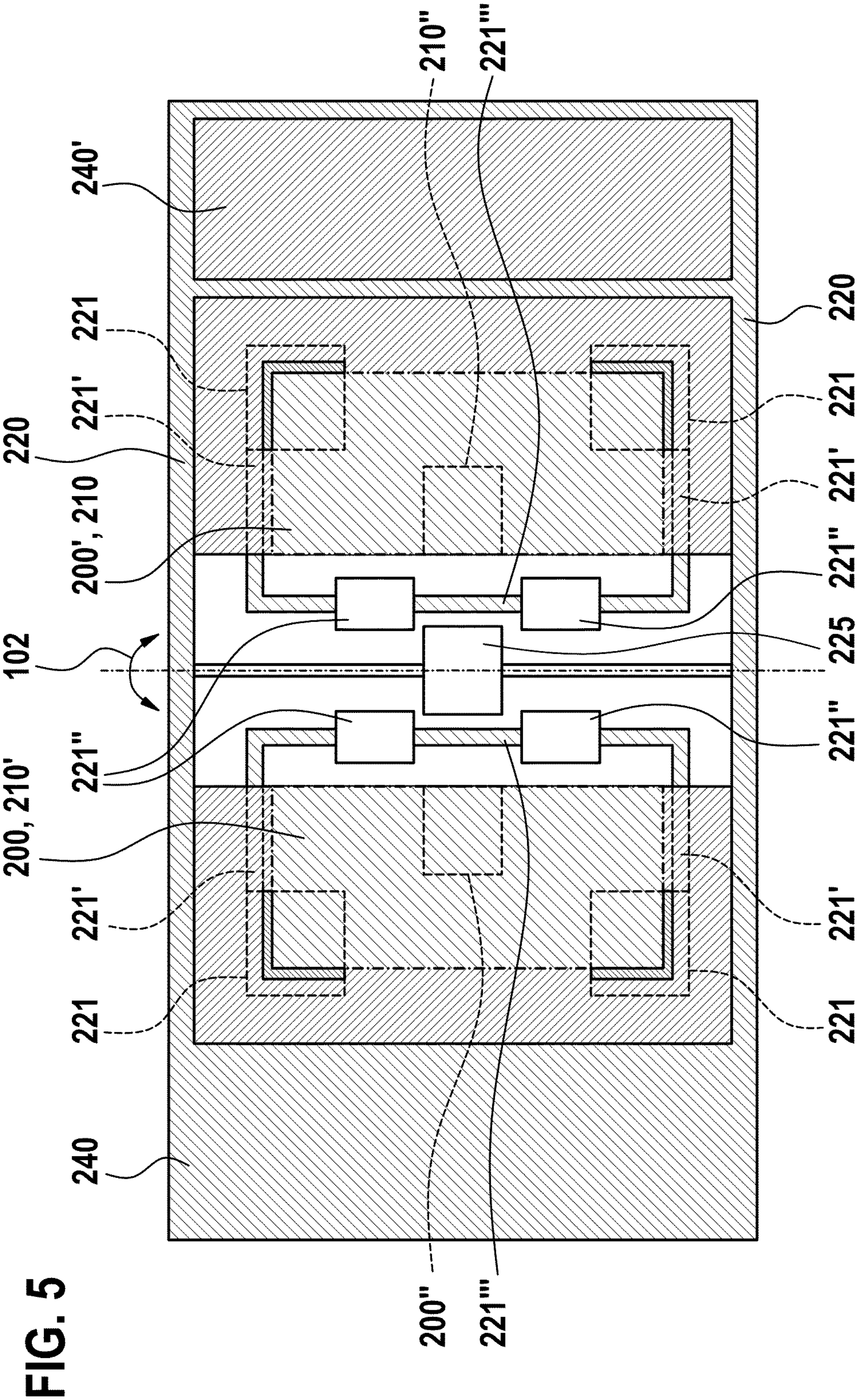
FIGS. 5 to 9 show further example embodiments of the micromechanical inertial sensor according to the present invention.

FIG. 5 shows a variant (or embodiment) in which the EP suspension 221' of the CMS electrode 221 is formed as a closed frame: as in FIGS. 4A-4D, two further substrate anchors 221" (for the EP suspensions 221') are present on both sides of the rotation axis 102; these two further substrate anchors are connected by a further connecting element 221'" to close the frame. This increases the overall stiffness of the stress sensor while requiring slightly more space. Additionally, the stability of these anchors can be increased by an optional mechanical connection (further connecting element 221'") of the further substrate anchors 221" associated with one another in each case, as a result of which the robustness of the stress sensor increases.

Figure 6:
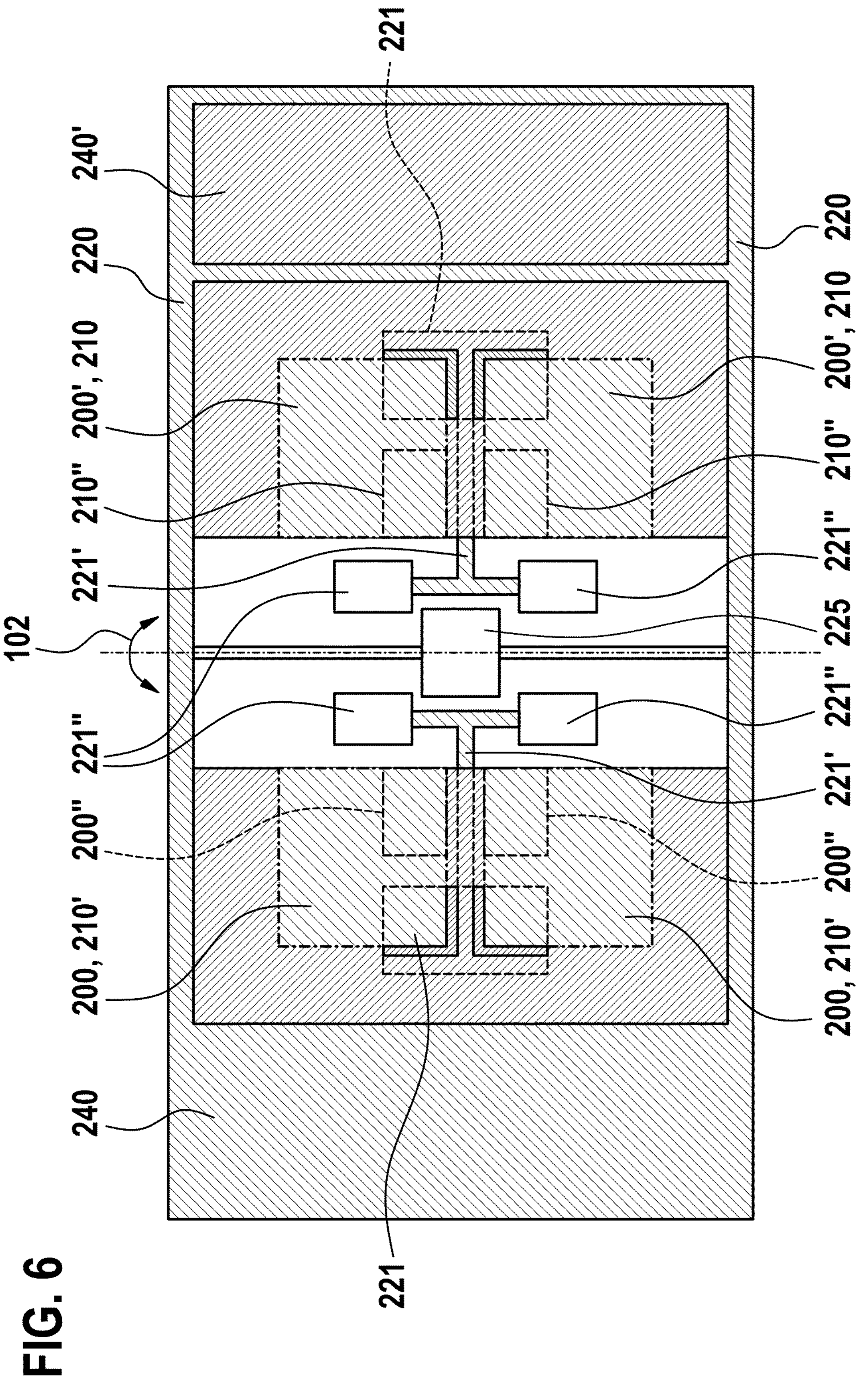

FIG. 6 shows a variant (or embodiment) in which the anchors of the top electrodes (C1a/C2a), i.e., the separate anchors 200" (for electrode 200) and 210" (for electrode 210), are divided. In addition, the CMS anchors (further substrate anchors 221") associated with one another in each case are connected by means of an EP bridge (similar to the further connecting element 221'" according to FIG. 5). An EP suspension is constructed on this bridge and extends through the resulting gap between the divided anchors (of the top electrodes (C1a/C2a)). At the end of the suspension, the CMS electrode 221 with stiffening structures is inserted vertically and centrally. This variant requires less space overall and achieves a significantly smaller protrusion of the CMS suspension. In addition, the suspension only protrudes in one direction. Both increase the stiffness of the structure of the stress sensor. It also facilitates the overall less complex EP suspension in the stress sensor in order to meet robustness requirements of the stress sensor.

Figure 7:
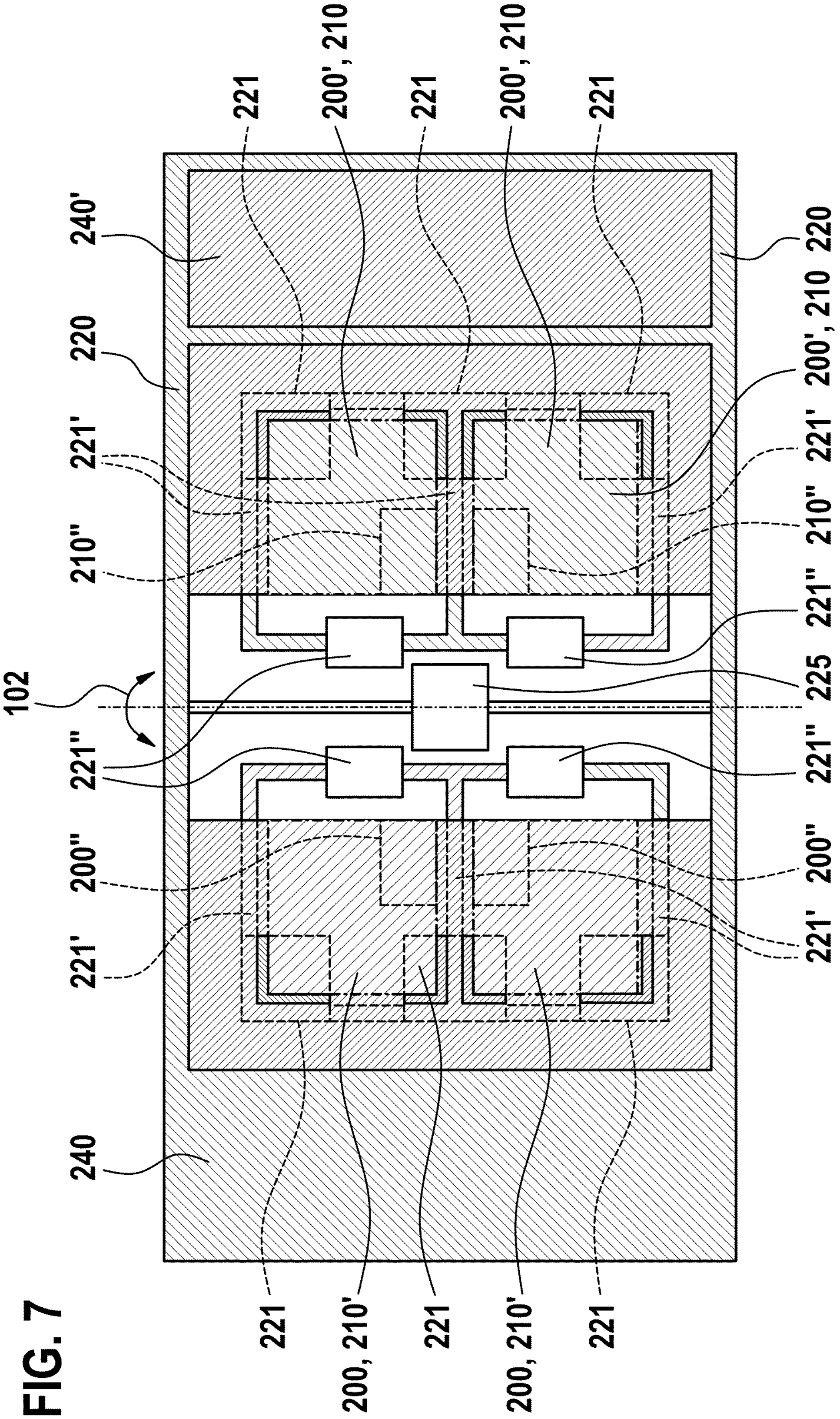

FIG. 7 shows a variant (or embodiment) in which the design features according to FIGS. 5 and 6 are combined: the design of the stress sensor becomes more complex overall; however, the larger suspension surface results in significantly more possibilities for inserting the CMS electrodes 221. As a result, the sensitivity of the stress sensor can be increased, for example.

Figure 8:
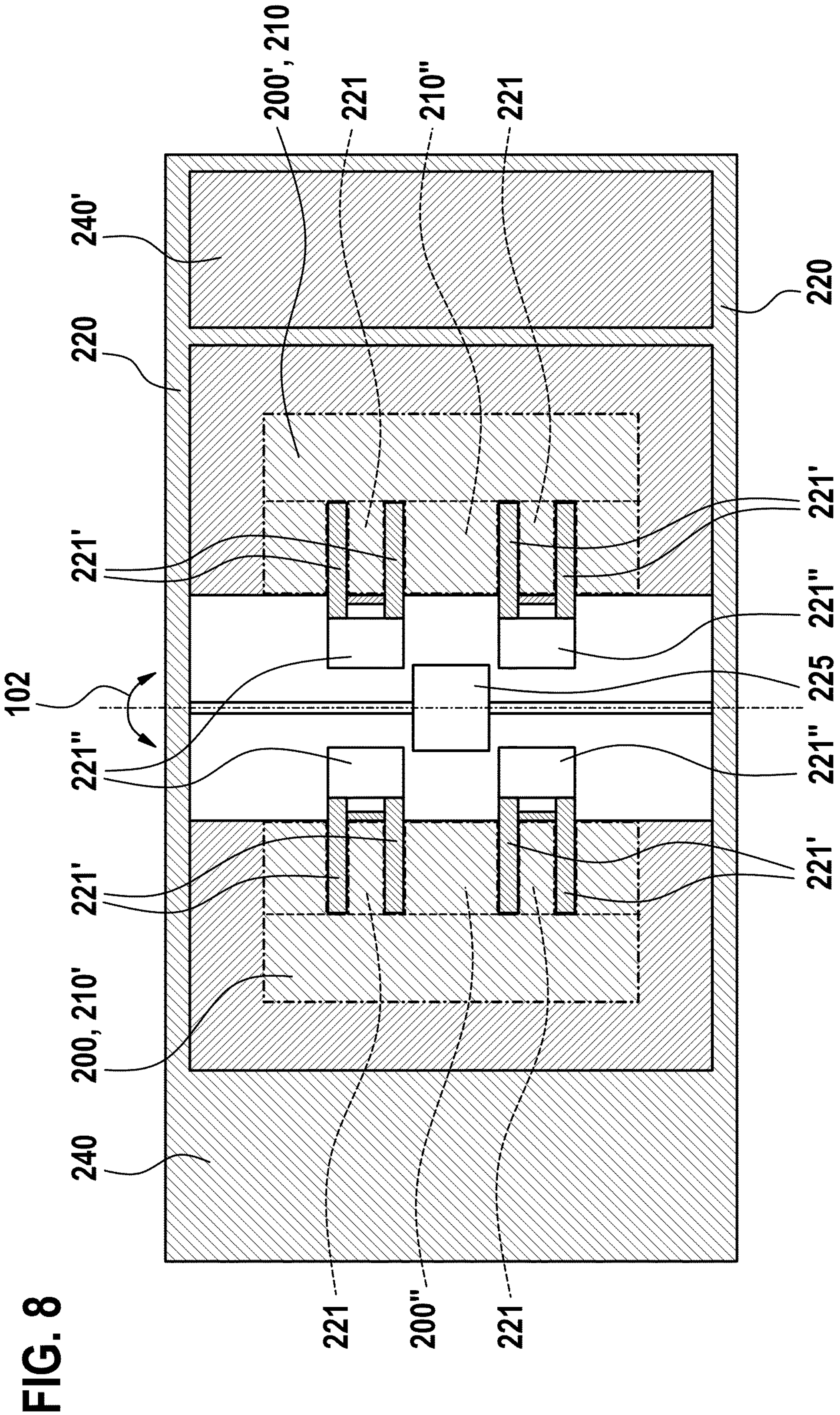

FIG. 8 shows a variant (or embodiment) in which the CMS electrodes 221 are inserted on the inner sides of the top electrodes (C1a/C2a) with respect to the rotation axis 102. For their suspension (of the CMS electrodes 221), only individual EP bars 221' are thus necessary. Although detecting the deformation close to the center reduces the sensitivity of the stress sensor, it makes maximum stiffness possible in the CMS suspension with only minimal intervention in the basic design of the sensor.

Figure 9:
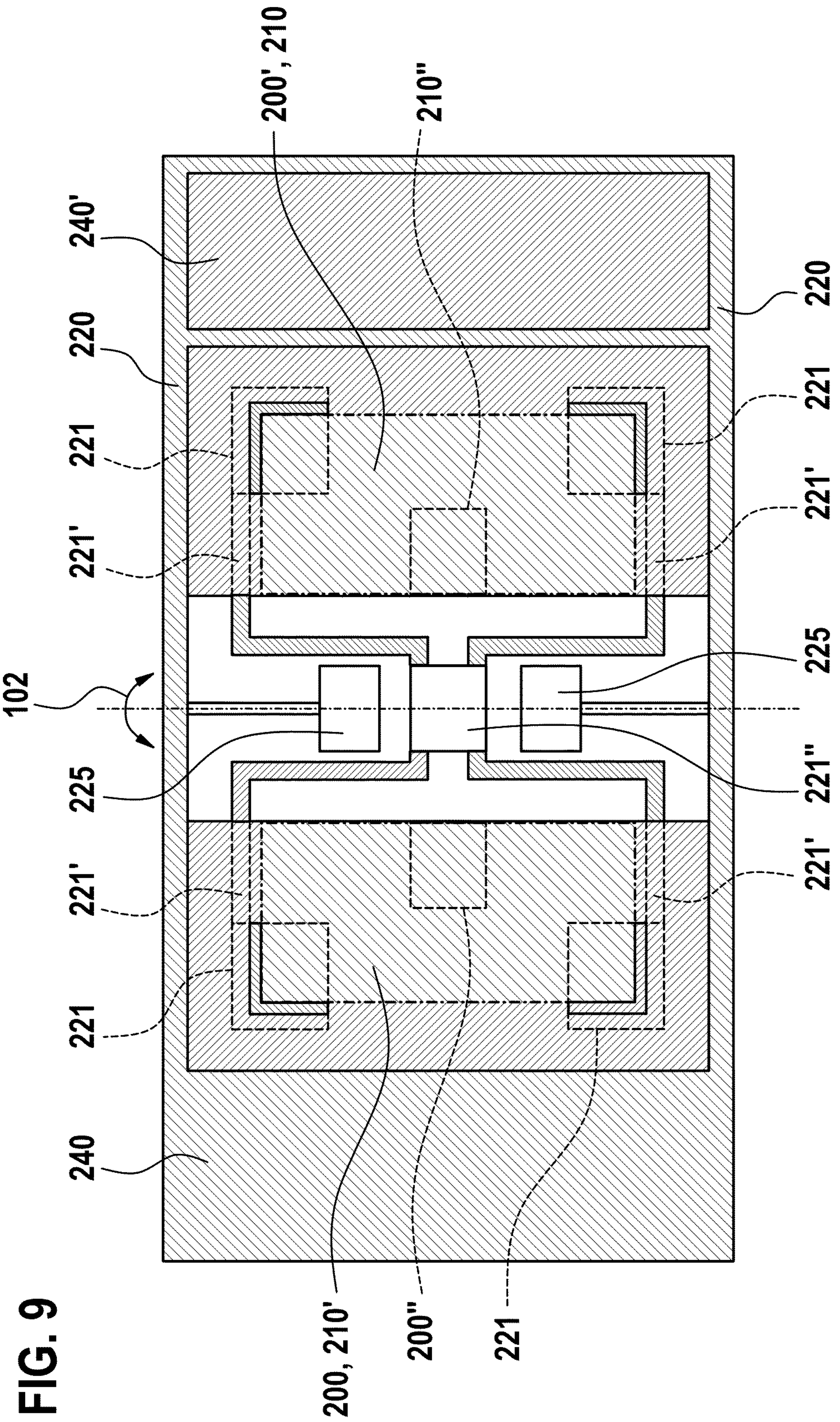

FIG. 9 shows a variant (or embodiment) in which a modified anchoring of the stress sensor and of the seismic mass is realized: In the above-described embodiments, the seismic mass (at CM potential) is suspended completely centrally (by means of the substrate anchor 225) and the anchors for the CMS electrodes 221 are arranged as closely to it as possible but placed slightly eccentrically; in the variant according to FIG. 9, the central anchor takes over the mounting of the CMS stress electrodes 221, and the seismic mass is suspended via two separate, vertically distributed anchors 225.

The suspension in the center and the exclusively vertical offset of all anchors minimizes the deviation between the deformation measured by the stress sensor and the deformation that actually induces error signals in the inertial sensor. This increases the accuracy of the measured offset signal. In addition, fewer anchors in total are required in this variant, which saves space.

The anchor variation described is exemplary and can also be transferred with the mentioned advantages to the designs of the above=mentioned embodiments.

The embodiments of the present invention described so far largely assume that the further sensor element is largely mechanically separated from the sensor element (in addition to their electrical separation); however, according to the present invention, it is also provided that the further sensor element (despite its electrical separation from the sensor element) is mechanically coupled at least to a certain extent; through such a mechanical connection of the CM anchors and CMS anchors, problematic deformations of the CM electrode are transferred very well to the CMS electrodes. This leads to a largely equal stress input to both the CM electrodes and the CMS electrodes. This increases the accuracy of the stress measurement/compensation.

Furthermore, it is advantageously possible according to the present invention that the sensor element comprises a first and a second sensor element so that further electrodes (hereinafter also referred to as CMX electrodes) are also present opposite the fixed electrodes C1 and C2. This arrangement is advantageous, for example, for a sensor with a very large measuring range. For this purpose, a very softly suspended mass (CM; first sensor element) and a harder-suspended mass (CMX; second sensor element) are used.

The sensitivity range can be switched by switching between CM and CMX. By switching to CMS, the offset, i.e., the bending effect, can be compensated for both measuring channels simultaneously.

Furthermore, it can advantageously be provided that the mass of the CMS channel (i.e., the further sensor element) is connected to the substrate 105 not in a hard manner, but only harder than the mass of the CM channel (i.e., the sensor element). The CMS channel can thus still be used to correct the CM channel with respect to an offset. At the same time, when the CM channel reaches its limit, the CMS channel can be used as an acceleration sensor for very high accelerations. This makes it possible to extend the measuring range of the sensor very easily and cost-effectively.

What is claimed is:

1. A micromechanical inertial sensor, comprising:

a sensor element;

a substrate having a substrate plane;

a detection device configured to detect a mechanical deflection due to tilting of the sensor element about a rotation axis substantially parallel to the substrate plane, wherein the mechanical deflection due to the tilting takes place along a detection direction substantially perpendicular to the substrate plane, wherein the detection device includes a first electrode structure and a second electrode structure that are firmly anchored to the substrate, and wherein the detection device generates a measurement signal from the detected mechanical deflection of the sensor element along the detection direction; and a further sensor element more firmly anchored to the substrate in comparison to the sensor element, wherein the first electrode structure and the second electrode structure are arranged along the detection direction opposite the further sensor element and the sensor element in such a way that variable capacitances are formed between the sensor element and the first electrode structure and between the sensor element and the second electrode structure, and a further variable capacitances are formed between the further sensor element and the first electrode structure and between the further sensor element and the second electrode structure;

wherein the detection device is configured to differentially detect the variable capacitances and the further variable capacitances;

wherein the micromechanical inertial sensor is configured in such a way that effects of mechanical stresses on the inertial sensor affect the first electrode structure and the second electrode structure as well as the sensor element and the further sensor element.

2. The micromechanical inertial sensor according to claim 1, wherein the micromechanical inertial sensor is configured in such a way that the effects of mechanical stresses on the inertial sensor in the measurement signal detected from the variable capacitances are compensated using a further measurement signal, wherein the further measurement signal is generated by the differential detection of the further variable capacitances so that it is possible to compensate for the effects of mechanical stresses on the inertial sensor in the measurement signal detected from the variable capacitances and to generate a compensated measurement signal.

3. The micromechanical inertial sensor according to claim 1, wherein the further sensor element and the sensor element are mechanically coupled.

4. The micromechanical inertial sensor according to claim 1, wherein:

the sensor element includes a first sensor element and a second sensor element, wherein the first sensor element is arranged along the detection direction opposite the first electrode structure and the second electrode structure in such a way that first variable capacitances are formed between the first sensor element and the first electrode structure and between the first sensor element and the second electrode structure, the second sensor element is arranged along the detection direction opposite the first electrode structure and the second electrode structure in such a way that second variable capacitances are formed between the second sensor element and the first electrode structure and between the second sensor element and the second electrode structure, and in comparison to the second sensor element, the first sensor element has a coupling to the substrate in the detection direction that is at least 2 times stronger.

5. The micromechanical inertial sensor according to claim 1, wherein, in comparison to the sensor element, the further sensor element has a coupling to the substrate in the detection direction that is at least 50 times stronger.

6. The micromechanical inertial sensor according to claim 1, wherein an anchoring structure of the further sensor element differs from: (i) an anchoring structure of the first electrode structure, and/or (ii) an anchoring structure of the second electrode structure.

7. A method for operating a micromechanical inertial sensor, the method comprising the following steps:

providing the micromechanical inertial sensor, the micromechanical inertial sensor including a sensor element, a substrate having a substrate plane, and a detection device configured to detect a mechanical deflection due to tilting of the sensor element about a rotation axis substantially parallel to the substrate plane, wherein the mechanical deflection due to the tilting takes place along a detection direction substantially perpendicular to the substrate plane, wherein the detection device includes a first electrode structure and a second electrode structure that are firmly anchored to the substrate, wherein the detection device is configured to generate a measurement signal from the detected mechanical deflection of the sensor element along the detection direction, wherein the micromechanical inertial sensor further includes a further sensor element, wherein the further sensor element is more firmly anchored to the substrate in comparison to the sensor element, wherein the first electrode structure and the second electrode structure are arranged along the detection direction opposite the further sensor element and the sensor element in such a way that variable capacitances are formed between the sensor element and the first electrode structure and between the sensor element and the second electrode structure, and further variable capacitances are formed between the further sensor element and the first electrode structure and between the further sensor element and the second electrode structure, wherein the detection device is configured to differentially detect the variable capacitances and the further variable capacitances, wherein effects of mechanical stresses on the inertial sensor affect the first electrode structure and the second electrode structure as well as the sensor element and the further sensor element; and operating the micromechanical inertial sensor.

* * * * *